United States Patent
Ryu et al.

(10) Patent No.: US 10,548,211 B2
(45) Date of Patent: Jan. 28, 2020

(54) RESONANT NETWORK FOR PLASMA POWER SUPPLY AND POWER SUPPLY DEVICE FOR PLASMA GENERATOR

(71) Applicants: NEW POWER PLASMA CO., LTD., Gyeonggi-do (KR); RESEARCH & BUSINESS FOUNDATION SUNGKYUNKWAN UNIVERSITY, Gyeonggi-do (KR)

(72) Inventors: Seung Hee Ryu, Gyeonggi-do (KR); Chang Seob Lim, Gyeonggi-do (KR); Hong Kweon Moon, Gyeonggi-do (KR); Won Yong Sung, Gyeonggi-do (KR); Geun Wan Koo, Gyeonggi-do (KR); Byoung Kuk Lee, Gyeonggi-do (KR)

(73) Assignees: NEW POWER PLASMA CO., LTD., Gyeonggi-Do (KR); RESEARCH & BUSINESS FOUNDATION SUNGKYUNKWAN UNIVER, Gyeonggi-Do (KR)

(*) Notice: Subject to any disclaimer, the term of this patent is extended or adjusted under 35 U.S.C. 154(b) by 0 days.

(21) Appl. No.: 16/136,691

(22) Filed: Sep. 20, 2018

(65) Prior Publication Data
US 2019/0357341 A1 Nov. 21, 2019

(30) Foreign Application Priority Data
May 17, 2018 (KR) .................. 10-2018-0056356

(51) Int. Cl.
| | | |
|---|---|---|
| H01J 37/24 | (2006.01) | |
| H01F 27/24 | (2006.01) | |
| H01J 37/32 | (2006.01) | |
| H05H 1/36 | (2006.01) | |
| G01R 21/06 | (2006.01) | |
| G01R 23/02 | (2006.01) | |
| H02M 5/42 | (2006.01) | |
| H05H 1/46 | (2006.01) | |
| H02M 3/155 | (2006.01) | |

(52) U.S. Cl.
CPC ............... *H05H 1/36* (2013.01); *G01R 21/06* (2013.01); *G01R 23/02* (2013.01); *H01F 27/24* (2013.01); *H01J 37/32009* (2013.01); *H02M 3/155* (2013.01); *H02M 5/42* (2013.01); *H05H 1/46* (2013.01)

(58) Field of Classification Search
CPC .. H05H 1/36; H05H 1/46; H01F 27/24; H01J 37/24; H01J 37/32009; H01J 37/321; H01J 37/3244; H02M 3/155; H02M 5/42
See application file for complete search history.

(56) References Cited

U.S. PATENT DOCUMENTS

| | | | | |
|---|---|---|---|---|
| 5,103,140 A | * | 4/1992 | Cocoma | H05B 41/24 313/234 |
| 2018/0247794 A1 | * | 8/2018 | Sung | H01J 37/32183 |

FOREIGN PATENT DOCUMENTS

| | | |
|---|---|---|
| JP | WO2012039035 | 2/2014 |
| KR | 1020110136805 | 12/2011 |

* cited by examiner

*Primary Examiner* — Jimmy T Vu
(74) *Attorney, Agent, or Firm* — Mayer & Williams, PC; Stuart H. Mayer

(57) ABSTRACT

Provided is a resonant network for plasma power supply, which is connected between a power supply unit and an output unit. The resonant network includes a resonant inductor connected in series with the power supply unit, a resonant capacitor connected in parallel with the output unit and connected in series with the resonant inductor, and a passive element connected in series with the output unit and the resonant inductor and connected in parallel with the resonant capacitor.

11 Claims, 6 Drawing Sheets

RESONANT NETWORK FOR PLASMA POWER SUPPLY AND POWER SUPPLY DEVICE FOR PLASMA GENERATOR

CROSS-REFERENCE TO RELATED APPLICATION

This application claims priority to Korean Patent Application No. 10-2018-0056356 filed on May 17, 2018 and all the benefits accruing therefrom under 35 U.S.C. § 119, the contents of which are incorporated by reference in their entirety.

BACKGROUND

The present invention relates to a plasma apparatus, and more particularly, to a resonant network for plasma power supply and a power supply device using the same.

To generate the high frequency power required by current plasma devices, a resonance type power conversion device which is easy to output a constant current is used. Although these power conversion devices generally control the output current with frequency control techniques, because of the electrical resistance of the plasma load that varies in inverse proportion to the output current in the case of a plasma load, it is impossible to control the output current by a general frequency control technique. In order to counter this, in the resonant converter for plasma load, after configuring a system using the LC resonant network of FIG. 6, the system is operated at a resonance frequency having a constant output current regardless of the electrical resistance of the load.

In addition, a plasma power conversion device including a resonant converter is recently used for semiconductor equipment and environmental purification equipment, and as its use is widespread, it requires a wide range of output current control. When the plasma power conversion device satisfies these requirements, at the same time, phase shift control is performed at the resonance frequency to avoid drop-out.

However, in order to perform the phase shift control and to control the output current in a wide area, a Zero Voltage Switching (ZVS) operating area must be considered in resonant network design. The resonant converter of the LC resonant network structure is limited in the design of an additional inductor by the plasma reactor, so that it was difficult to perform ZVS operation at low current in the design range having the output current range of the LC resonant network.

In addition, when ZVS operation is difficult, switches of a power supply may receive great stress and affect system safety.

SUMMARY

The present invention provides a resonant network for plasma power supply and a power supply device for plasma generator capable of operating zero-voltage switching (ZVS) at a wide range of output current.

In accordance with an exemplary embodiment, a resonant network for plasma power supply, which is connected between a power supply unit and an output unit, the resonant network including: a resonant inductor connected in series with the power supply unit; a resonant capacitor connected in parallel with the output unit and connected in series with the resonant inductor; and a passive element connected in series with the output unit and the resonant inductor and connected in parallel with the resonant capacitor.

The resonant network may further include an additional inductor connected in series with the passive element and the output unit.

The passive element may include a capacitor to expand a zero-voltage switching (ZVS) region of the power supply unit.

The capacitor of the passive element may be configured to have a smaller device value than the resonant capacitor.

A voltage and a current magnitude of the power supply unit and a phase difference of a resonance frequency may be adjusted by the passive element.

A phase shift control of the resonance frequency may be performed and a voltage of the power supply unit may be adjusted by the phase shift control.

In accordance with another exemplary embodiment, a power supply device for igniting a plasma into a plasma generator, the power supply device including: a power supply unit; a transformer including a ferrite core coupled to the plasma generator and a primary winding wound on the ferrite core; and a resonant network connected between the power supply unit and the primary winding, wherein the resonant network includes: a resonant inductor connected in series with the power supply unit; a resonant capacitor connected in parallel with the primary winding and connected in series with the resonant inductor; and a passive element connected in series with the primary winding and the resonant inductor and connected in parallel with the resonant capacitor.

The power supply device may further include an additional inductor connected in series with the passive element and the output unit.

The passive element may include a capacitor to expand a zero-voltage switching (ZVS) region of the power supply unit.

The power supply unit may include a rectifier and an inverter, wherein a voltage and a current magnitude of the inverter and a phase difference of a resonance frequency may be adjusted by the passive element.

A phase shift control of the resonance frequency may be performed and a voltage of the inverter may be adjusted by the phase shift control.

BRIEF DESCRIPTION OF THE DRAWINGS

Exemplary embodiments can be understood in more detail from the following description taken in conjunction with the accompanying drawings, in which.

DETAILED DESCRIPTION

Hereinafter, embodiments of the present invention are described in more detail with reference to the accompanying drawings. However, the present invention may be embodied in different forms and should not be construed as limited to the embodiments set forth herein, and rather, these embodiments are provided so that this disclosure will be thorough and complete, and will fully convey the scope of the present invention to those skilled in the art. Also, at least some of the components may be exaggerated or reduced in size for convenience of explanation.

In addition, the following embodiments are provided to allow those skilled in the art to understand the present invention to a sufficient degree, and may be modified into various other forms. The scope of the present invention is not limited to the embodiments described below.

Also, in the following embodiments, the term "including" or "having" means that a feature, or element, described in the specification is present, but does not preclude the possibility that one or more other features or components may be added.

Hereinafter, a resonant network for plasma power supply according to an embodiment of the present invention will be described with reference to FIG. 1.

Figure 1:
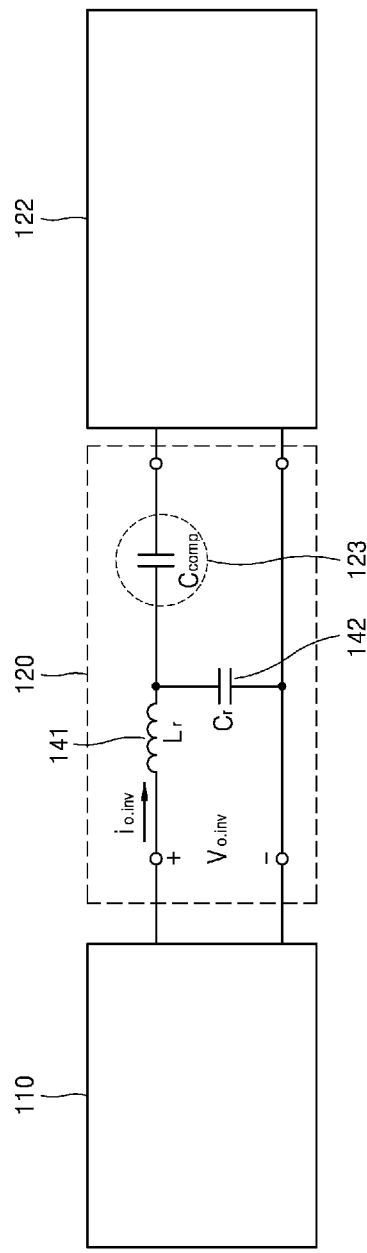
FIG. 1 is a diagram illustrating a resonant network for plasma power supply according to an embodiment of the present invention.

Referring to FIG. 1, a resonant network for plasma power supply 120 of the present invention may include a resonant inductor 141, a resonant capacitor 142, and a passive element 123.

More specifically, the resonant network for plasma power supply 120 of the present invention may include a LC resonant network circuit 600 having a resonant inductor 141 connected between a power supply unit 110 and an output unit 122, and connected in series to a resonant capacitor 142. At this time, the resonant inductor 141 may be connected in series with the power supply unit 110, and the resonant capacitor 142 may be connected in parallel with the output 122 and in series with the resonant inductor 141, so that a low pass filter (LPF) may be formed.

Meanwhile, the resonant network for plasma power supply 120 of the present invention may include a passive element 123 in the LC resonant network 600. More specifically, passive element 123 may be connected in series with output 122 and resonant inductor 141 and in parallel with resonant capacitor 142.

For example, the passive element 123 may be formed of a capacitor C, and the capacitor C of the passive element 123 may be configured to have a smaller device value than the resonant capacitor 142.

In more detail, the resonant network for plasma power supply 120 of the present invention may adjust the voltage or current of the power supply unit 110 and the phase difference of the resonance frequency by the passive element 123.

Also, by adjusting the voltage or current of the power supply unit 110 and the phase difference of the resonance frequency, for example, the inverter, according to the passive element 123, the phase difference of the resonance frequency may be large even at low output currents compared to the LC resonant network 600, and at the same time, zero-voltage switching (ZVS) may be operated even if the phase difference of the resonance frequency is large. A detailed description thereof will be described later in detail with reference to FIGS. 7A to 8B.

Figure 2:
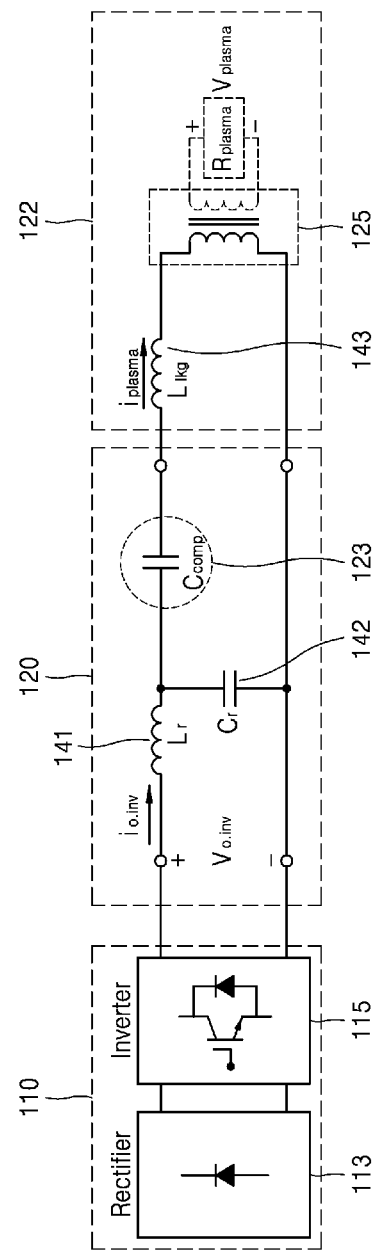
FIG. 2 is a diagram illustrating a resonant network for plasma power supply according to another embodiment of the present invention.

FIG. 2 is a resonant network for plasma power supply according to another embodiment of the present invention.

Referring to FIG. 2, a power supply unit 110 may include a rectifier 113 and an inverter 115. The front end of the resonant network for plasma power supply 120 may be connected to the inverter 115 of the power supply unit 110. The output unit 122 includes a transformer 125 and the resonant network 120 may be connected to the rear end of the resonant network 120 with an additional inductor 143 interposed.

On the other hand, the additional inductor 143 may be a parasitic inductor, and in this case, the additional inductor 143 may be understood as a configuration of the resonant network for plasma power supply 120. In this case, the additional inductor 143 may be understood to be connected in series with the capacitor 123. In this case, the resonant network 120 may form an LCCL network structure.

Figure 3:
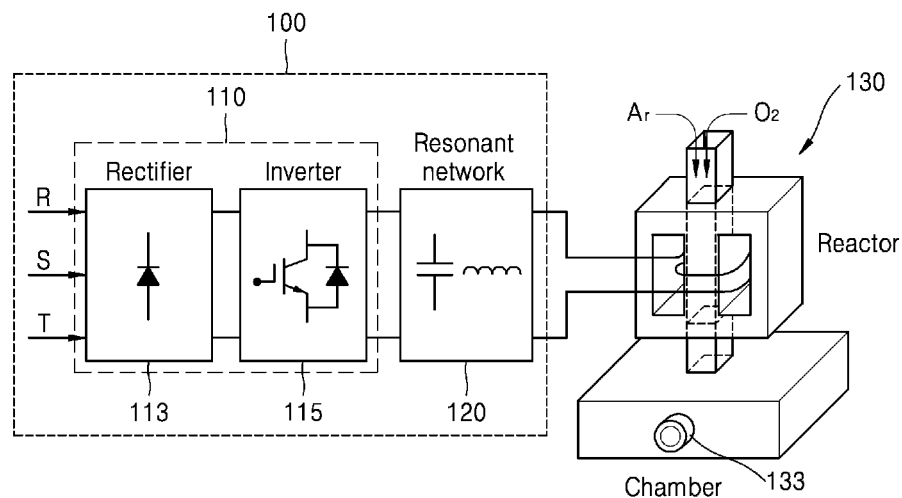
FIG. 3 is a diagram illustrating a power supply device for plasma generator according to an embodiment of the present invention.

FIG. 3 is a diagram of a power supply device for plasma generator according to an embodiment of the present invention.

Referring to FIG. 3, a plasma power supply device 100 includes a power supply unit 110, a resonant network for plasma power supply 120, and a transformer 125. At this point, the power supply unit 110 may include a rectifier 113 and an inverter 115.

In this case, in one embodiment in FIG. 3, a toroidal shaped plasma source is illustrated by way of example. Although the power supply unit 110 includes the rectifier 113 and the inverter 115, the power supply unit 110 may be converted into various configurations depending on the system designer.

The plasma power supply device 100 is configured to transfer energy to ignite the plasma into the plasma generator 130. The energy of the plasma power supply device 100 may ignite or generate plasma that is inductively coupled through the transformer with the gas passing through the plasma generator 130.

At this point, the transformer 125 includes a ferrite core, a primary winding. The ferrite core may be connected to the plasma discharge channel to surround a part of the body, and the primary winding may be provided to surround the ferrite core.

Meanwhile, the plasma generator 130 has a body for receiving a gas (Ar or $O_2$) convertible to plasma as a plasma source. One or more sides of the body may be exposed to the process chamber 133 such that the charged particles generated by the plasma are in direct contact with the material to be treated.

At this time, the current is induced in the gas in the plasma generator 130 to cause ignition of the plasma, and once the plasma is generated, the plasma may be used to excite other source gases to generate the desired reaction gas.

Figure 4:
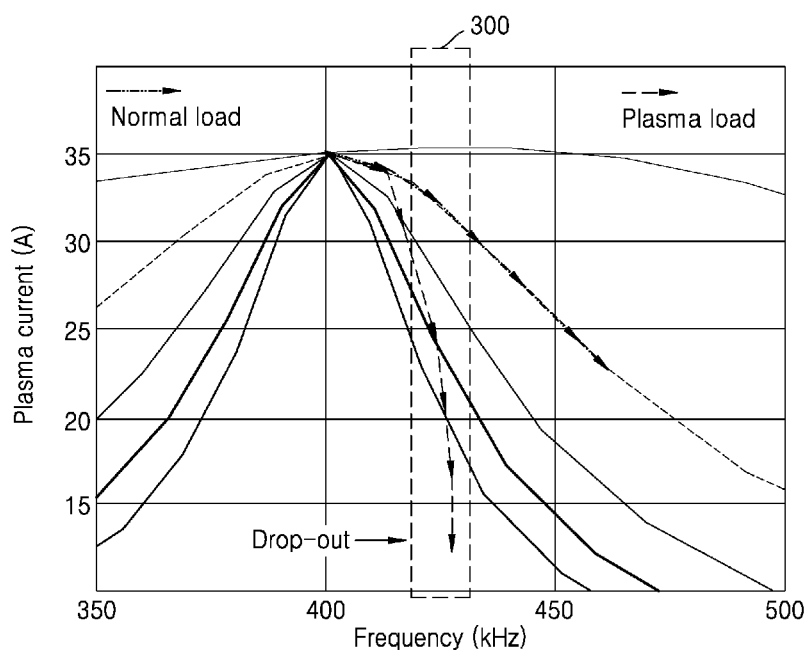
FIG. 4 is a graph showing a drop-out phenomenon which is a problem during frequency control in a plasma load.

Meanwhile, to prevent the drop-out phenomenon as shown in FIG. 4, the power supply device for plasma generator of the present invention performs phase shift control at a resonance frequency. The drop-out phenomenon will be described with reference to FIG. 4.

FIG. 4 is a graph showing a drop-out phenomenon which is a problem during frequency control in a plasma load.

The drop-out phenomenon 300 refers to a phenomenon in which plasma is not maintained due to a failure when a certain amount of energy may not be supplied to the gas.

After the plasma is ignited, the electrical resistance value is inversely proportional to the current applied to the plasma generator. Due to this characteristic, the drop-out phenomenon 300 occurs when a resonant power supply device is used for a plasma load.

When the drop-out phenomenon 300 occurs, there arises a problem in processes such as etching and cleaning in the semiconductor manufacturing process. There may be a time loss to restart the plasma generator. In order to prevent the drop-out phenomenon 300, the present invention performs phase shift control at the resonance frequency.

At this time, when controlling the phase shift of the plasma power supply device at the resonance frequency, the fundamental wave size is reduced. This will be described with reference to FIG. 5.

Figure 5:
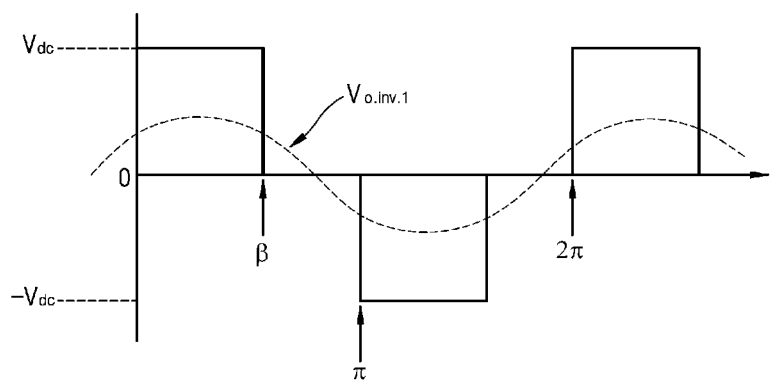
FIG. 5 is a graph showing the magnitude of an inverter output current according to the degree of phase shift during the phase shift control of a power supply for plasma.

FIG. 5 is a graph showing the magnitude of an inverter output current according to the degree of phase shift during the phase shift control of a power supply for plasma.

Referring to FIG. 5, in the phase shift control of the power supply device for plasma, the inverter output voltage gradually decreases. In more detail, in the inverter output voltage graph, as the interval between π and 2π is reduced compared to the interval between 0 and π, the output voltage of the inverter becomes smaller in the phase shift control. The size of the corresponding fundamental wave becomes smaller, and the magnitude of the load-side current $I_{plasma}$ may be reduced by the reduced fundamental wave.

Therefore, when phase shift control is performed in a power supply device for plasma generator, the magnitude of the fundamental wave may be controlled.

Meanwhile, at the resonance frequency of the present invention, the reduction amount of the inverter fundamental wave according to the phase shift angle of the power supply device for plasma generator 100 may be calculated by Formula 1.

$$v_{o.inv.1} = \frac{4V_{DC} \cdot \sin(\beta/2)}{\pi} \cos\left(\omega t - \frac{\beta}{2}\right) \quad \text{[Formula 1]}$$

$V_{o.inv.1}$: inverter output voltage $V_{o.inv.1}$: inverter output voltage

Figure 6:
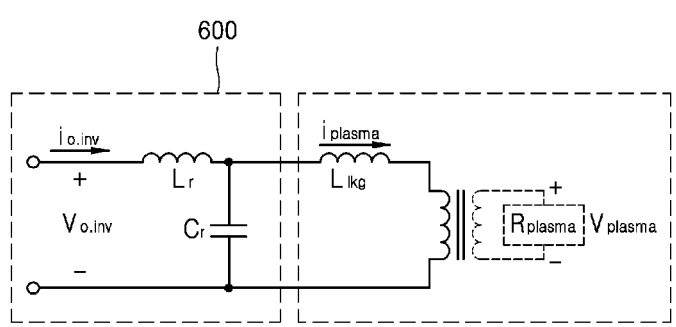
FIG. 6 is a circuit diagram for a prior art LC resonant network.

FIG. 6 is a circuit diagram for a conventional LC resonant network.

Referring to FIG. 6, the conventional LC resonant network 600 may include a resonant inductor $L_r$ connected in series with the power supply unit and a resonant capacitor $C_r$ connected in parallel with the output unit and connected in series with the resonant inductor $L_r$.

At this time, the plasma power supply device including the LC resonant network 600 performs phase shift control at the resonance frequency to avoid drop-out. In the case of a resonance-type converter of the structure of the LC Resonant network 600, since the design of the additional inductor Llkg is limited by the plasma reactor, the LC resonant network 600 has a problem that ZVS operation may not be performed at a low current of a design specification having a wide output current range.

Therefore, in order to enable ZVS operation at low current of the output current, the present invention proposes the resonant network for plasma power supply 120 with a passive element 123 added thereto. In more detail, with reference to FIGS. 7A, 7B, 8A, and 8B, the output current and the resonance frequency phase difference of the LC resonant network 600 and the resonant network for plasma power supply 120 of the present invention are compared and described.

Figure 7A:
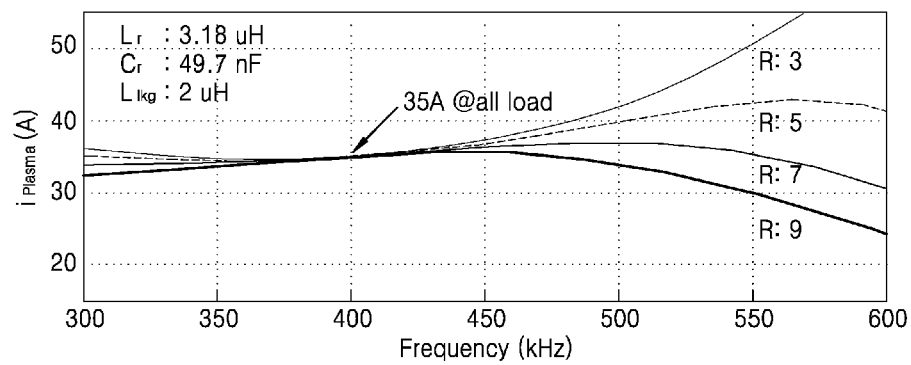
FIGS. 7A and 7B are graphs for explaining a phase difference between an output current and a resonance frequency of an LC resonant network.
Figure 7B:
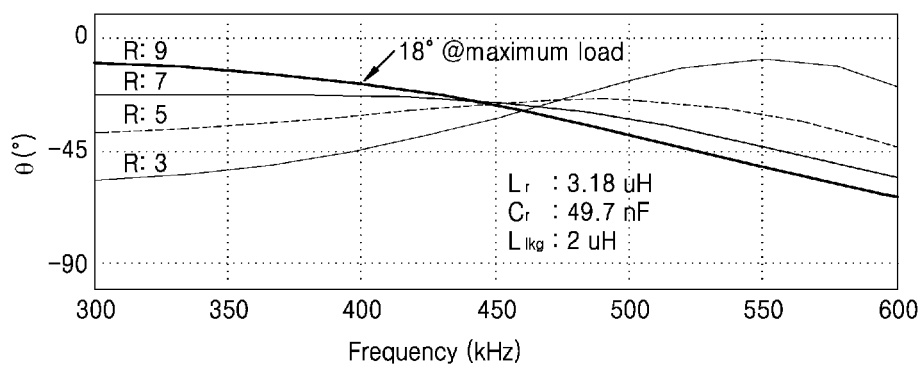

Referring to FIGS. 7A and 7B, ZVS may be operated only in the region for the 18 degree phase difference at the low output current (for example, 35 A) of the inverter in the LC resonant network 600.

In this case, since ZVS operation is impossible when applying a larger phase difference of the resonance frequency in the LC resonant network 600, there is a limit to ZVS operation at low output currents. If ZVS is impossible, the switch of the plasma power supply device receives great stress, and affects system safety.

Therefore, the resonant network for plasma power supply 120 of the present invention adds the passive element 123 to the LC resonant network 600 so as to adjust the voltage or current of the inverter and the phase difference of the resonance frequency according to the passive element 123, so that it may apply a larger phase difference at the same low current output voltage (for example, 35 A) as the LC resonant network 600, and allow ZVS operation at the same time.

Figure 8A:
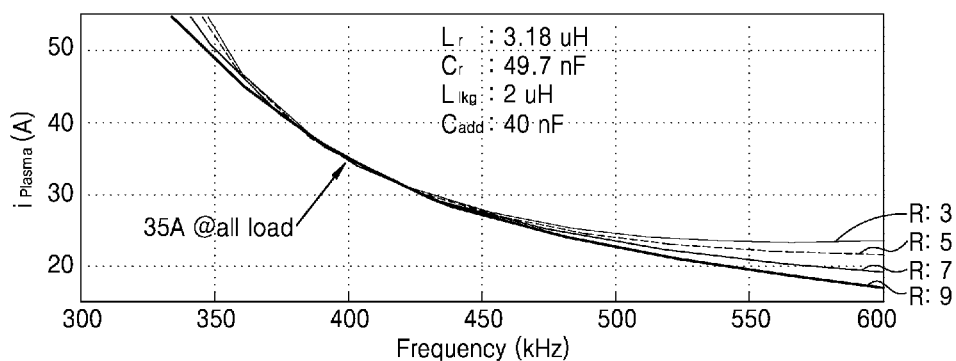
FIGS. 8A and 8B are graphs for explaining a phase difference between an output current and a resonance frequency of a resonant network for plasma power supply according to an embodiment of the present invention.
Figure 8B:
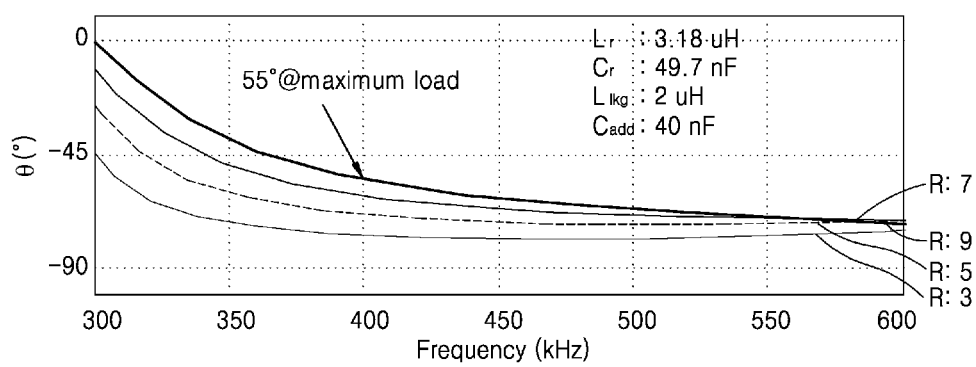

In more detail, referring to FIGS. 8A and 8B, the resonant network for plasma power supply 120 of the present invention adjusts the phase difference of the resonance frequency by the passive element 123 at the same low output voltage 35A as that of the LC resonant network 600 so as to operate ZVS at a phase difference of 55 degrees.

Therefore, the resonant network for plasma power supply 120 of the present invention may operate ZVS at a phase difference of 55 degrees larger than the phase difference of 18 degrees compared to the LC resonant network 600, so that it may operate ZVS in a wider output current region compared to the LC resonant network 600.

Meanwhile, although the output current magnitude of the LC resonant network 600 and the output current magnitude of the resonant network for plasma power supply 120 are the same, the reason why the phase difference of the resonant network for plasma power supply 120 becomes larger than the phase difference of the LC resonant network will be described through Formulas 2 to 5.

The output current magnitude of the conventional LC resonant network 600 may be calculated using Formula 2.

$$i_{plasma}(s) = \quad \text{[Formula 2]}$$

$$\frac{1}{sL_{lkg} + R_{plasma}} \frac{\left((sL_{lkg} + R_{plasma}) // \frac{1}{sC_r}\right)}{\left(sL_r + (sL_{lkg} + R_{plasma}) // \frac{1}{sC_r}\right)} v_{o.inv}(s) \Rightarrow$$

$$i_{plasma}(f_r) = \frac{v_{o.inv.1} \sqrt{C_r}}{\sqrt{L_r}}$$

In addition, the output current magnitude of the resonant network for plasma power supply 120 of the present invention may be calculated using Formula 3.

$$i_{plasma}(s) = \quad \text{[Formula 3]}$$

$$\frac{1}{sL_{lkg} + R_{plasma}} \frac{\left(\left(sL_{lkg} + \frac{1}{sC_{add}} + R_{plasma}\right) // \frac{1}{sC_r}\right)}{\left(sL_r + \left(sL_{lkg} + \frac{1}{sC_{add}} + R_{plasma}\right) // \frac{1}{sC_r}\right)}$$

$$v_{o.inv}(s) \Rightarrow i_{plasma}(f_r) = \frac{v_{o.inv.1}\sqrt{C_r}}{\sqrt{L_r}}$$

Here, when the output currents of the LC resonant network 600 and the resonant network for plasma power supply 120 are calculated, it may be confirmed that the output current magnitudes in the frequency domain of Formula 2 and Formula 3 are the same.

However, the current phase difference of the LC resonant network 600 may be calculated as shown in Formula 4.

$$\theta_{LCL}(s) = \tan^{-1}\left[\left(sL_r + (sL_{lkg} + R_{plasma})//\frac{1}{sC_r}\right)\right] \Rightarrow \theta_{LCL}(f_r) = \tan^{-1}\left[\frac{(L_r - L_{lkg})}{R\sqrt{L_rC_r}}\right]$$ [Formula 4]

The current phase difference of the resonant network for plasma power supply 120 may be calculated as shown in Formula 5.

$$\theta_{LCCL}(s) = \tan^{-1}\left[\left(sL_r + \left(sL_{lkg} + \frac{1}{sC_{add}} + R_{plasma}\right)//\frac{1}{sC_r}\right)\right] \Rightarrow$$ [Formula 5]

$$\theta_{LCCL}(f_r) = \tan^{-1}\left[\frac{\sqrt{L_rC_r}}{R_{plasma}C_{add}} + \frac{(L_r - L_{lkg})}{\sqrt{L_rC_r}R_{plasma}}\right]$$

In comparison, as shown in Formulas 2 and 3, although the output currents in the frequency domain of the LC resonant network 600 and the resonant network for plasma power supply 120 are calculated identically, it may be confirmed that the current phase difference is greater for the resonant network for plasma power supply 120 than for LC resonant network 600.

Therefore, when the output currents of the present invention and the conventional LC resonant network 600 are the same, since the phase difference of the resonance frequency is calculated to be larger than that of the LC resonant network, the resonant network for plasma power supply 600 proposed in the present invention may extend a ZVS region compared to the LC resonant network 120.

In this case, in order to expand a ZVS region, a mathematical analysis of Formulas 3 and 5 applied to the present invention is required, and at this time, the mathematical analysis is a part that those skilled in the art having a sufficient understanding of the resonant network must understand about the plasma load characteristic.

Meanwhile, although the formula may be composed of a complex fifth-order or higher polynomial in the conventional formula, since Formula 3 and Formula 5 applied to the present invention are changed from the fifth order equation to a simple equation based on the use of the network by limiting the resonance frequency, the formula may be easily calculated.

A resonant network for plasma power supply according to an embodiment of the present invention and a power supply device for plasma generator using the same may control output currents to prevent a drop-out phenomenon using a phase shift technique at resonance frequency.

Also, by adding a passive element to the resonant network for plasma power, the passive element may adjust the voltage and the current of the inverter or the phase difference of the resonance frequency. Due to this, it is possible to perform ZVS operation at a wide range of output currents. Of course, the scope of the present invention is not limited by these effects.

Although the resonant network for plasma power supply and the power supply device using the same have been described with reference to the specific embodiments, they are not limited thereto. Therefore, it will be readily understood by those skilled in the art that various modifications and changes can be made thereto without departing from the spirit and scope of the present invention defined by the appended.

What is claimed is:

1. A resonant network for plasma power supply, which is connected between a power supply unit and an output unit, the resonant network comprising:
   a resonant inductor connected in series with the power supply unit;
   a resonant capacitor connected in parallel with the output unit and connected in series with the resonant inductor; and
   a passive element connected in series with the output unit and the resonant inductor and connected in parallel with the resonant capacitor.

2. The resonant network of claim 1, further comprising an additional inductor connected in series with the passive element and the output unit.

3. The resonant network of claim 1, wherein the passive element comprises a capacitor to expand a zero-voltage switching (ZVS) region of the power supply unit.

4. The resonant network of claim 3, wherein the capacitor of the passive element is configured to have a smaller device value than the resonant capacitor.

5. The resonant network of claim 3, wherein a voltage and a current magnitude of the power supply unit, and a phase difference of a resonance frequency are adjusted by the passive element.

6. The resonant network of claim 5, wherein a phase shift control of the resonance frequency is performed and a voltage of the power supply unit is adjusted by the phase shift control.

7. A power supply device for igniting a plasma into a plasma generator, the power supply device comprising:
   a power supply unit;
   a transformer comprising a ferrite core coupled to the plasma generator and a primary winding wound on the ferrite core; and
   a resonant network connected between the power supply unit and the primary winding,
   wherein the resonant network comprises:
   a resonant inductor connected in series with the power supply unit;
   a resonant capacitor connected in parallel with the primary winding and connected in series with the resonant inductor; and
   a passive element connected in series with the primary winding and the resonant inductor and connected in parallel with the resonant capacitor.

8. The power supply device of claim 7, further comprising an additional inductor connected in series with the passive element and the output unit.

9. The power supply device of claim 7, wherein the passive element comprises a capacitor to expand a zero-voltage switching (ZVS) region of the power supply unit.

10. The power supply device of claim 9, wherein the power supply unit comprises a rectifier and an inverter, wherein a voltage and a current magnitude of the inverter, and a phase difference of a resonance frequency are adjusted by the passive element.

11. The power supply device of claim 10, wherein a phase shift control of the resonance frequency is performed and a voltage of the inverter is adjusted by the phase shift control.

* * * * *